(12) United States Patent
Vincent et al.

(10) Patent No.: US 9,520,323 B2
(45) Date of Patent: Dec. 13, 2016

(54) MICROELECTRONIC PACKAGES HAVING TRENCH VIAS AND METHODS FOR THE MANUFACTURE THEREOF

(75) Inventors: Michael B Vincent, Chandler, AZ (US); Zhiwei Gong, Chandler, AZ (US); Scott M Hayes, Chandler, AZ (US); Douglas G Mitchell, Tempe, AZ (US)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 931 days.

(21) Appl. No.: 13/610,488

(22) Filed: Sep. 11, 2012

(65) Prior Publication Data

US 2014/0070415 A1 Mar. 13, 2014

(51) Int. Cl.
| | |
|---|---|
| *H01L 23/52* | (2006.01) |
| *H01L 21/768* | (2006.01) |
| *H01L 23/528* | (2006.01) |
| *H01L 23/00* | (2006.01) |
| *H01L 23/485* | (2006.01) |
| *H01L 23/525* | (2006.01) |

(52) U.S. Cl.
CPC ... *H01L 21/76816* (2013.01); *H01L 21/76814* (2013.01); *H01L 23/528* (2013.01); *H01L 24/19* (2013.01); *H01L 24/96* (2013.01); *H01L 23/485* (2013.01); *H01L 23/525* (2013.01); *H01L 2224/0231* (2013.01); *H01L 2224/02375* (2013.01); *H01L 2224/04105* (2013.01); *H01L 2924/12042* (2013.01)

(58) Field of Classification Search
CPC ................. H01L 2224/02375; H01L 21/76816
See application file for complete search history.

(56) References Cited

U.S. PATENT DOCUMENTS

| | | | |
|---|---|---|---|
| 5,026,667 A | 6/1991 | Roberts, Jr. | |
| 6,323,127 B1 * | 11/2001 | Andricacos | ............. H01L 28/65 257/E21.013 |
| 6,556,453 B2 | 4/2003 | Figueroa et al. | |
| 6,822,191 B2 | 11/2004 | De Steur et al. | |
| 7,528,069 B2 | 5/2009 | Wenzel et al. | |
| 8,093,722 B2 * | 1/2012 | Chen | ..................... H01L 21/563 257/737 |
| 2001/0033021 A1 * | 10/2001 | Shimoishizaka | ... H01L 23/3114 257/737 |
| 2002/0071256 A1 | 6/2002 | Figueroa et al. | |
| 2006/0240660 A1 * | 10/2006 | Yang | ................. H01L 21/76816 438/622 |

(Continued)

*Primary Examiner* — Mark Tornow
*Assistant Examiner* — Abbigale Boyle

(57) ABSTRACT

Embodiments of a microelectronic package including at least one trench via are provided, as are embodiments of a method for fabricating such a microelectronic package. In one embodiment, the method includes the step of depositing a dielectric layer over a first microelectronic device having a plurality of contact pads, which are covered by the dielectric layer. A trench via is formed in the dielectric layer to expose the plurality of contact pads therethrough. The trench via is formed to include opposing crenulated sidewalls having a plurality of recesses therein. The plurality of contact pads exposed through the trench via are then sputter etched. A plurality of interconnect lines is formed over the dielectric layer, each of which is electrically coupled to a different one of the plurality of contact pads.

18 Claims, 12 Drawing Sheets

(56) References Cited

U.S. PATENT DOCUMENTS

| | | | |
|---|---|---|---|
| 2007/0102828 A1* | 5/2007 | Wenzel | H01L 23/485 |
| | | | 257/780 |
| 2007/0201193 A1* | 8/2007 | Tsuji | H01L 21/561 |
| | | | 361/820 |
| 2011/0207323 A1 | 8/2011 | Ditizio | |
| 2011/0227232 A1 | 9/2011 | Bonilla et al. | |
| 2013/0154062 A1* | 6/2013 | Lin | H01L 23/3128 |
| | | | 257/620 |

* cited by examiner

MICROELECTRONIC PACKAGES HAVING TRENCH VIAS AND METHODS FOR THE MANUFACTURE THEREOF

TECHNICAL FIELD

Embodiments of the present invention relate generally to microelectronic packaging and, more particularly, to microelectronic packages having improved trench via-based interconnect structures, as well as to methods for the manufacture thereof.

BACKGROUND

Fan-out wafer level packaging ("FOWLP") processes often entail the formation of redistribution layers over the surface of a die package, which includes a molded package body in which one or more semiconductor die carrying integrated circuits ("ICs") are embedded. The redistribution layers provide electrical interconnection between contact pads located on the IC die and a contact array, such as a ball grid array, formed over a surface of the completed die package. In this manner, the redistribution layers allow the contact pads to have a relatively tight pad-to-pad spacing or pitch, while still providing a comparably large surface area over which the the contact array can be distributed or fanned-out. To produce the redistribution layers, one or more layers of dielectric or passivation material are initially deposited over the IC die and cover the contact pads. In one conventional approach, a separate via is etched through the dielectric layer to expose a portion of each contact pad, metal plugs or other conductors are then formed in each via to provide ohmic contact with the contact pad, and then a circuit or interconnect line is formed in contact with each conductor. More recently, an improved approach has been introduced wherein a single elongated via referred to as a "trench via" is formed to simultaneously expose multiple contact pads through the overlying dielectric, and interconnect lines are subsequently formed to extend into the trench via and directly contact the contact pads located therein. Such an approach enables fine pitch interconnect structures to be produced in the redistribution layers in an efficient and reliable manner.

BRIEF DESCRIPTION OF THE DRAWINGS

At least one example of the present invention will hereinafter be described in conjunction with the following figures, wherein like numerals denote like elements, and.

Figure 1:
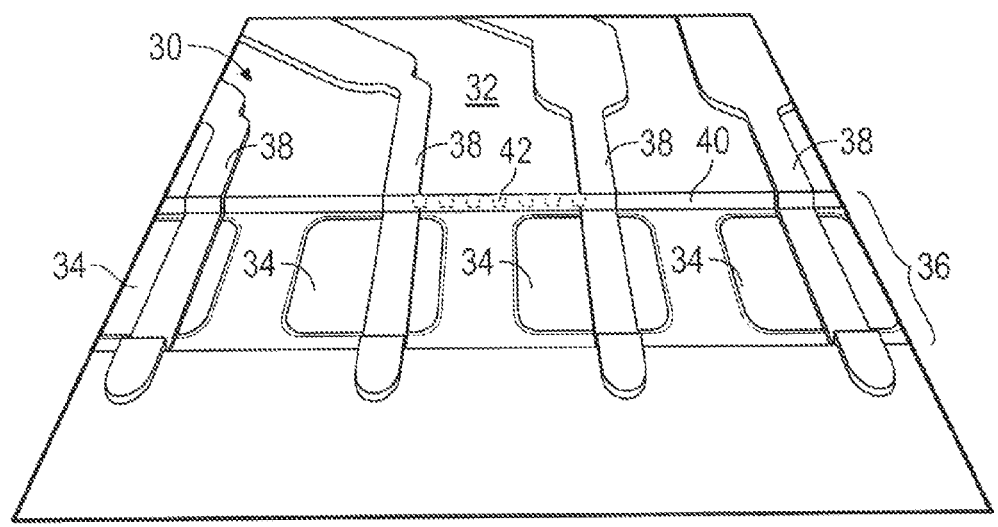
FIG. 1 is a top-down perspective view of an exemplary microelectronic package (partially shown) including a trench via and produced in accordance with the teachings of prior art.

For simplicity and clarity of illustration, the drawing figures illustrate the general manner of construction and may omit depiction, descriptions, and details of well-known features and techniques to avoid unnecessarily obscuring the exemplary and non-limiting embodiments of the invention described in the subsequent Detailed Description. It should further be understood that features or elements appearing in the accompanying figures are not necessarily drawn to scale unless otherwise stated. For example, the dimensions of certain elements or regions in the figures may be exaggerated relative to other elements or regions to improve understanding of embodiments of the invention.

DETAILED DESCRIPTION

The following Detailed Description is merely exemplary in nature and is not intended to limit the invention or the application and uses of the invention. Any implementation described herein as exemplary is not necessarily to be construed as preferred or advantageous over other implementations. Furthermore, there is no intention to be bound by any theory presented in the preceding Background or the following Detailed Description.

Terms such as "first," "second," "third," "fourth," and the like, if appearing in the description and the subsequent claims, may be utilized to distinguish between similar elements and are not necessarily used to indicate a particular sequential or chronological order. Such terms may thus be used interchangeably and that embodiments of the invention are capable of operation in sequences other than those illustrated or otherwise described herein. Furthermore, terms such as "comprise," "include," "have," and the like are intended to cover non-exclusive inclusions, such that a process, method, article, or apparatus that comprises a list of elements is not necessarily limited to those elements, but may include other elements not expressly listed or inherent to such process, method, article, or apparatus. The term "coupled," as appearing herein, is defined as directly or indirectly connected in an electrical or non-electrical manner. Furthermore, the terms "substantial" and "substantially" are utilized to indicate that a particular feature or condition is sufficient to accomplish a stated purpose in a practical manner and that minor imperfections or variations, if any, are not significant for the stated purpose.

As appearing herein, the term "microelectronic device" is utilized in a broad sense to refer to an electronic device, element, or component produced on a relatively small scale and amenable to packaging in the below-described manner. Microelectronic devices include, but are not limited to, ICs formed on semiconductor die, microelectromechanical systems ("MEMS"), passive electronic components, optical devices, and other small scale electronic devices capable of providing processing, memory, sensing, radiofrequency, optical, and actuator functionalities, to list but a few examples. The term "microelectronic package" denotes a structure or assembly containing at least one and typically two or more microelectronic devices, which may or may not be electrically interconnected. Similarly, the term "System-in-Package" or, more simply, "SiP" is utilized to refer to a microelectronic package including two microelectronic devices that differ in structure and/or function. As further appearing herein, the term "contact pad" is utilized to refer to an electrically-conductive element or contact point of a microelectronic device, as previously defined. Finally, the phrases "fabricated from," "formed from," and similar terms and phrases are utilized to denote that at least a portion of a particular structural element, such as a contact or die pad, contains a named material, such as palladium or gold, as a primary constituent; and not necessarily that the particular structural element is fabricated entirely from the named material.

FIG. 1 is a top-down view (shown from a slightly tilted or angled perspective view) of a portion of a microelectronic package 30 illustrated in a partially-completed state and produced in accordance with the teachings of prior art. The illustrated portion of microelectronic package 30 includes one or more layers of dielectric material 32, which have been formed over an integrated circuit die (hidden from view in FIG. 1). The IC die includes a row of contact pads 34, several of which are exposed through dielectric material 32 by an elongated trench via 36. Interconnect lines 38, such as metal traces, are formed over dielectric material 32 and extend into trench via 36 to contact pads 34. Each interconnect line 38 contacts a different contact pad 34 to provide electrical communication therewith; e.g., interconnect lines 38 may electrically couple each contact pad 34 to a different contact included in a contact array number later formed over the upper surface of microelectronic package 30. By forming an elongated trench via 36 exposing multiple aligned contact pads 34 in this manner, a relatively narrow pad-to-pad spacing or fine pitch can be achieved as compared to other conventional fabrication techniques wherein multiple separate vias are formed to expose each individual contact pads and a conductor, such as a metal plug, is formed in each via. Further description of an exemplary fabrication technique suitable for producing fine pitch trench via-based interconnect structures of this type can be found in U.S. Pat. No. 7,528,069 B2, issued on May 5, 2009, entitled "FINE PITCH INTERCONNECT AND METHOD OF MAKING," and assigned to the assignee of the instant Application.

During production of microelectronic package 30, it may be desired to sputter etch the upper surfaces of contact pads 34 to, for example, remove any debris, oxides, passivation material, or other contamination therefrom after the formation of trench via 36. Contact pads 34 are often formed from aluminum or a similar material having a relatively low sputter rate; that is, a material that is relatively resistant to dislodgement or sputtering of the contact pad material in the presence of a high energy sputter etch. The parameters of the sputter etch may thus be tuned to be relatively aggressive to ensure complete removal of any contaminants present on the upper surfaces of contact pads 34. The present inventors have recognized a need to simultaneously process one or more microelectronic packages each containing multiple microelectronic devices, which, in turn, each include a number of contact pads exposed by a trench via. In certain cases, the contact pad material may vary between the microelectronic devices such that the contact pads of one microelectronic device are formed from a first material, such as aluminum, resistant to sputter etch dislodgement; while the contact pads of a second microelectronic device are formed from a different material having a relatively high sputter rate and prone to dislodgement in the presence of a high energy sputter etch. A non-exhaustive list of materials, which have relatively high sputter rates and from which one or more of the contact pads of the second microelectronic device may be formed, includes palladium, gold, copper, tin, silver, and lead. As a result, if a high energy sputter etch is performed simultaneously on both devices, undesirably large amounts of contact pad material from the second microelectronic device may dislodge from the contact pads and redeposit on the opposing sidewalls of the trench via. In more conventional interconnect structures wherein discrete vias are formed to individually expose each contact pad, such dislodgement and redeposition on the via sidewalls is generally acceptable as adjacent vias are inherently separated by a partitioning wall and, thus, do not provide a continuous surface extending between neighboring pads; however, in the case of a via trench-based interconnect structure, the opposing lateral sidewalls of the trench via (identified in FIG. 1 by reference numerals "40") provide a continuous surface extending between neighboring pads 34 and interconnect lines 38. Consequently, and as indicated in FIG. 1 by dashed line 42, and without implicit admission as to a recognition of this problem in the prior art, redeposition of the pad material on trench via sidewalls 40 can result in the creation of electrical leakage paths between neighboring pads 34 and/or interconnect lines 38 thereby negatively impacting the performance of microelectronic package 30. While it may be possible to adjust the parameters of the sputter etch to minimize the dislodgement and redeposition of the contact pad material prone to dislodgement in the presence of an aggressive sputter etch, this generally reduces the effectiveness of the sputter etch in removing contaminants from the contact pads fabricated from materials less susceptible to such issues.

By way of non-limiting example, the following describes exemplary embodiments of a fabrication method for producing a microelectronic package, such as System-in-Package, including at least one microelectronic device having a high density, trench via-based interconnect structure wherein the formation of undesired electrical leakage paths is precluded even when one or more of the contact pads are fabricated from a material prone to sputter etch dislodgement and a high energy sputter etch is performed during the fabrication process. In certain embodiments, this is accomplished by imparting the trench vias with crenulated, undulating, or pocketed sidewalls, which disrupt the continuous surface typically provided by the trench via sidewall to prevent contact pad material redeposited onto the trench sidewalls from forming a continuous leakage path between neighboring contact pads or interconnect lines. Additionally, the recesses or pockets formed in the crenulated trench via sidewalls may also minimize the volume of contact pad material deposited onto the sidewalls by allowing a greater percentage of the contact pad material particles dislodged from the contact pad to avoid impacting the sidewalls during the sputter etch process. Examples of a trench via having crenulated sidewalls, as well as processes suitable for forming such a crenulated trench via, are described below in conjunction with FIGS. 2-25. In addition to or as an alternative to imparting the trench via sidewalls with a crenulated planform shape, a lateral clearance may be provided between the contact pads and the lower edges of the trench sidewalls to further minimize the volume of contact pad material deposited onto the sidewalls during a high energy sputter etch, as described more fully below in conjunction with FIGS. 26 and 27.

Figure 2:
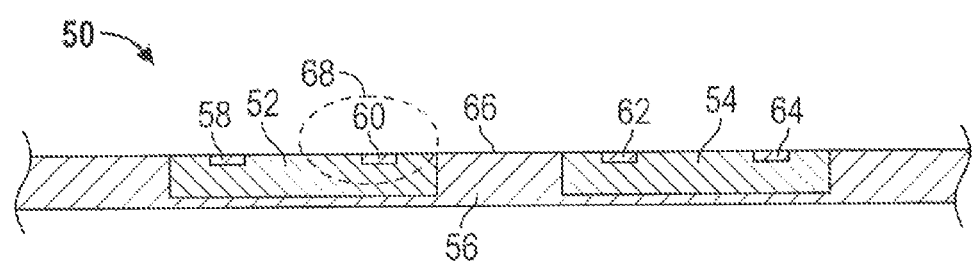
FIGS. 2-20 illustrate an exemplary microelectronic package including a crenulated through trench via at various stages of completion and produced in accordance with an embodiment of the exemplary fabrication method described herein.

FIG. 2 is a simplified cross-sectional view of a portion of a partially-completed microelectronic package 50, as illustrated in accordance with an exemplary and non-limiting embodiment of the present invention. The illustrated portion of microelectronic package 50 includes first and second microelectronic devices 52 and 54 embedded within a package body 56 in a side-by-side relationship. Microelectronic package 50 may also be referred to as a "System-in-Package" in embodiments wherein microelectronic devices 52 and 54 differ in function or structure. Microelectronic devices 52 and 54 each include one or more rows of contact pads (also commonly referred to as "land pads" or "die pads" in embodiments wherein devices 52 and 54 assume the form of IC die). For example, and with the understanding that only one contact pad in each row is visible in the illustrated cross-sectional view), microelectronic device 52 may include first and second rows of contact pads 58 and 60, which may extend along substantially parallel axes (into the page in the illustrated orientation). Similarly, microelectronic device 54 may include first and second rows of contact pads 62 and 64, which likewise extend along substantially parallel axes. As further shown in FIG. 2, microelectronic devices 52 and 54 are exposed through a surface 66 of package body 56 (referred to herein as "device surface 66") such that the contacts included within rows 58, 60, 62, and 64 are exposed from the exterior of microelectronic package 50.

Package body 56 is conveniently, although not necessarily, produced utilizing a Redistributed Chip Packaging ("RCP") manufacturing process. If produced utilizing such a process, microelectronic package 50 may be connected to a number of other microelectronic packages (not shown), which are joined or interconnected as an RCP device panel at this stage in the manufacturing process. In such embodiments, the RCP device panel may be produced in the following manner. First, a number of microelectronic devices (in which devices 52 and 54 are included) are distributed in a desired spatial arrangement over the surface of a support substrate or carrier. One more release layers may also be applied or formed over the carrier's supper surface prior to positioning of the microelectronic devices. A mold frame, which has a central cavity or opening therethrough, is positioned over the carrier and around the array of microelectronic devices. An encapsulant, such as a silica-filled epoxy, is then dispensed into the cavity of the mold frame and flows over the microelectronic devices. Sufficient volume of the encapsulant is typically dispensed over the microelectronic devices to enable the encapsulant to flow over the uppermost or non-contact-bearing surfaces of devices. The encapsulant may then be solidified by, for example, an oven cure to yield a solid panel body in which the microelectronic devices are embedded. The panel body may be rigid or flexible, depending upon the chosen encapsulant. The panel body is then released from the carrier to reveal the backside of the panel body through which the devices are exposed; e.g., device surface 66 in FIG. 2. If desired, the front side of the panel body may be ground or polished to bring the device panel to a desired thickness prior to release of the panel body from the carrier. In alternative embodiment, the panel body may be produced utilizing other known fabrication techniques, such as compression molding and lamination processes. The RCP device panel is later singulated, after fabrication of the below-described redistribution layers and contact formations, to yield a plurality of discrete microelectronic packages.

One or more redistribution layers are built-up over device surface 66 of partially-completed microelectronic package 50 to provide electrical connection between the contact pads included within pad rows 58, 60, 62, and 64 and corresponding contacts included within a subsequently-produced contact formation, such as a ball grid array, fabricated over the uppermost redistribution layers. The redistribution layers will typically include at least one layer of dielectric material in which or over which a plurality of interconnect lines is formed. The interconnect lines may be fabricated as metal traces, such as copper traces; and, in embodiments wherein multiple, successively-formed redistribution layers are present, the interconnect lines may be formed in different levels and electrically connected by way of filled vias, plated vias, metal plugs, and the like. For ease of description, the following will primarily describe the manner in which a number of interconnect lines is formed over device surface 66 and in ohmic contact with a number of contact pads included within contact pad row 60 of microelectronic device 52. It will be appreciated, however, similar processes can likewise be utilized to form interconnect lines in ohmic contact with the contact pads included within contact pad row 58 of microelectronic device 52 and the contact pads included within contact pad rows 62 and 64 of microelectronic device 54. The below-described interconnect fabrication process is advantageously performed simultaneously for the contact pads included within both microelectronic device 52 and microelectronic device 54, as well as any other microelectronic device that may be included within package 50. Furthermore, in embodiments wherein partially-completed package 50 is joined to a number of other partially-completed packages included within a pre-singulated RCP device panel, the following process can be performed globally for all devices included within the RCP device panel (so-called "panel level processing") to improve fabrication efficiency and throughput.

Figure 3:
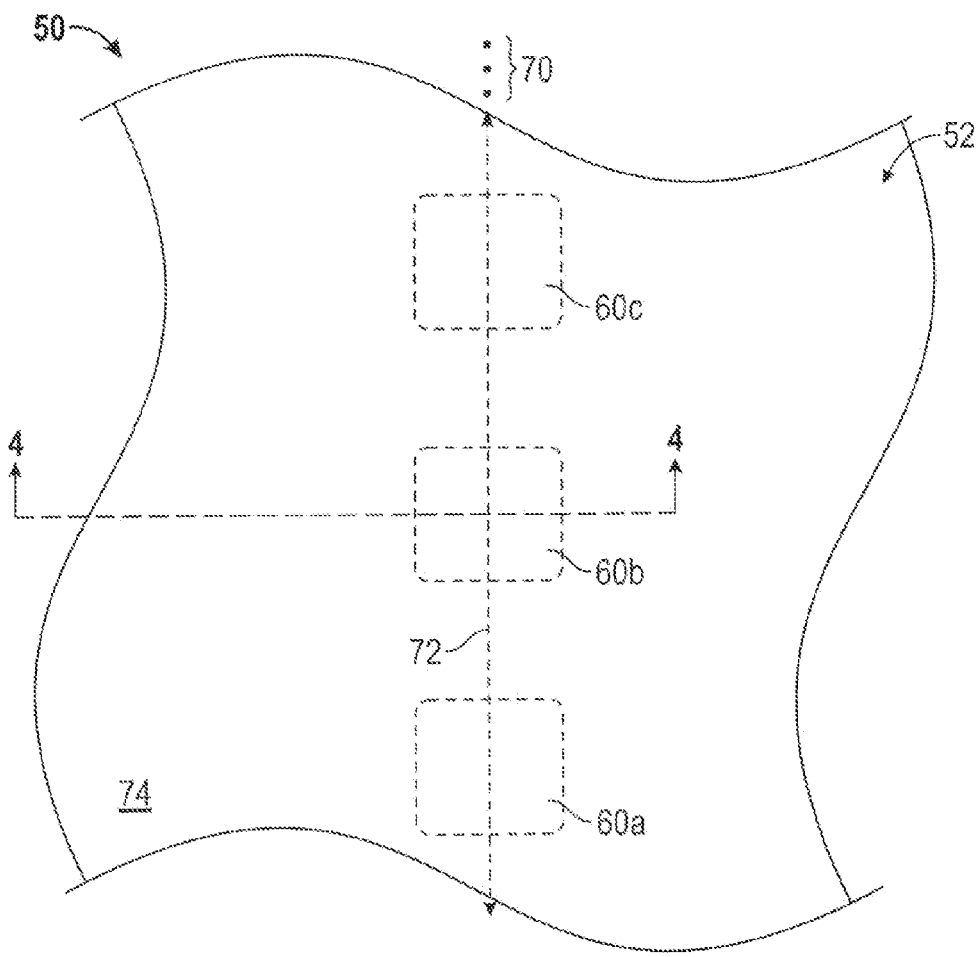
Figure 4:
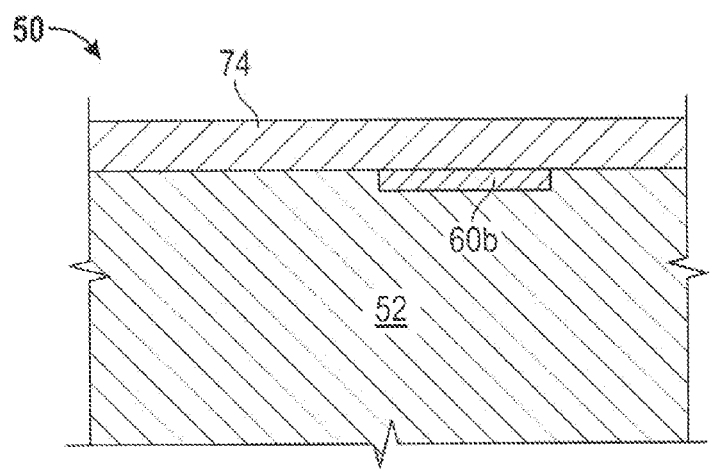

FIG. 3 is a top-down view of a portion of microelectronic device 52; and FIG. 4 is a cross-sectional view of a portion of microelectronic device 52, as taken along line 4-4 in FIG. 3. To provide a frame of reference, the portion of microelectronic device 52 illustrated in FIGS. 3 and 4 generally corresponds to the portion of device 52 identified in FIG. 2 by dashed circle 68. As can be seen most readily in FIG. 3, contact row 60 includes at least three contacts: contact 60(*a*), contact 60(*b*), and 60(*c*). As indicated in FIG. 3 by ellipses 70, contact row 60 may also include a number of additional contacts, which are not shown for clarity. Contact pads 60(*a*)-(*c*) and any other contact pads included within contact pad row 60 are positioned in a substantially linear arrangement and spaced apart along longitudinal axis 72 (FIG. 3) at substantially regular intervals, although this need not always be the case. Referring briefly once again to FIG. 2, contact pad rows 58, 62, and 64 may also include similar linearly-distributed groupings of contact pads, which may be spaced along axes substantially parallel to axis 72.

As noted above, and referring collectively to FIGS. 2-4, the contacts include within contact rows 58, 60, 62, and 64 may or may not have substantially similar shapes, sizes, pitch, and, orientation. However, in certain embodiments, the contact pads included within contact pad row 60 (and likely also the contact pads included within contact pad row 58) may differ from the contact pads included within rows 62 and 64 in at least one notable respect, namely, at least one and typically all of the contact pads included within row 60 may be fabricated from a different material than are the contact pads included within rows 62 and 64. In particular, at least one and typically all of the contact pads included within row 60 (FIGS. 2-4) may be fabricated from a first material (e.g., palladium, gold, copper, tin, silver, or lead, with palladium and gold preferred) that is prone to dislodgement when subjected to an aggressive sputter etch of the type described below in conjunction with FIGS. 7 and 8; while the contact pads included within rows 62 and 64 (FIG. 2) may be fabricated from a second material, such as aluminum, that is less susceptible to dislodgement in the presence of such a high energy sputter etch. For this reason, embodiments of the below-described fabrication process entail the formation of a crenulated trench via to expose the contact pads included within row 60 (and also row 58, if appropriate), which prevents or at least minimizes the creation of electrical leakage paths during the below-described sputter etch process. Although the possibility is by no means excluded, crenulated trench vias typically need not be formed during interconnection of contact pad rows 62 and 64 in embodiments wherein the contact contained therein are fabricated from a material resistant to dislodgement during the sputter etch process described below.

As shown in FIGS. 3 and 4, dielectric material 74 is next deposited over the upper surface of microelectronic device 52. Dielectric material 74 may be deposited as one or more layers of electrically-insulative and/or passivation material; however, for ease of explanation, dielectric material 74 is illustrated in FIGS. 3 and 4 and referred to below as a single layer. Dielectric layer 74 covers contact pads 60(*a*)-(*c*) included within contact row 60 (illustrated in phantom in FIG. 3). In one embodiment, dielectric layer 74 is formed from an organic polymer, such as an epoxy, deposited utilizing a spin-on coating technique. In further embodiments, various other electrically-insulative materials deposited or otherwise formed over the upper surface of microelectronic device 52 utilizing other known techniques. By way of non-limiting example, dielectric layer 74 may be deposited to a thickness of about 5 to about 30 microns.

Figure 5:
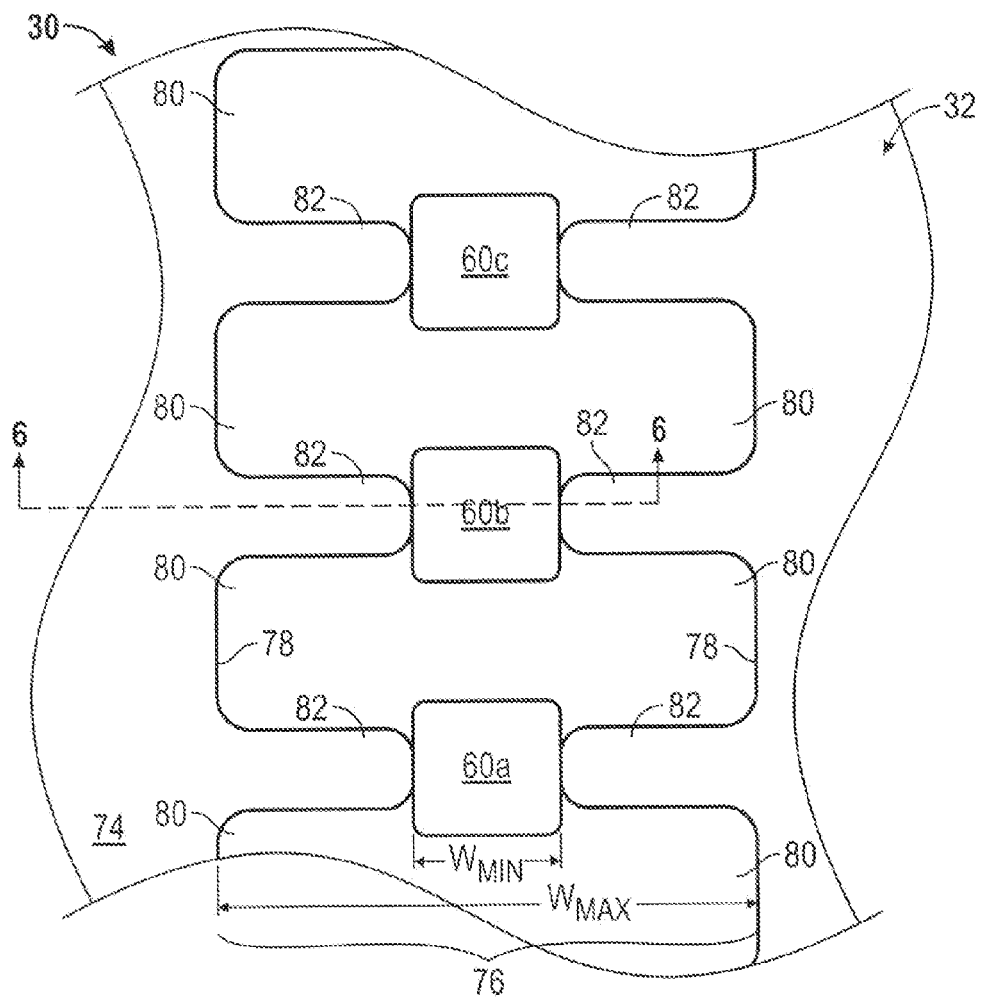
Figure 6:
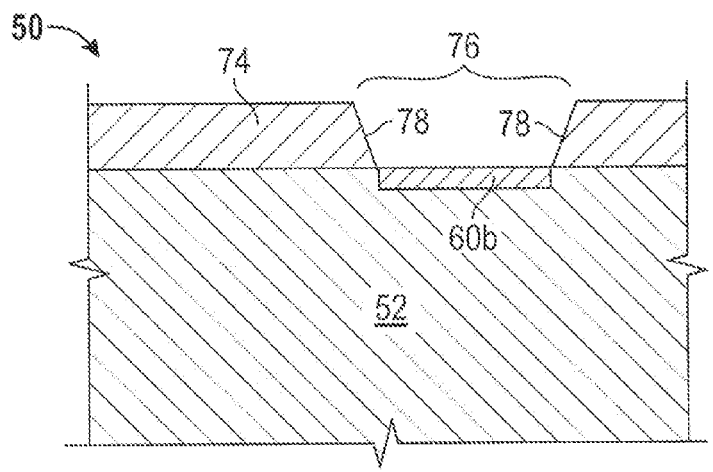

Turning to FIGS. 5 and 6, a trench via 76 is next formed within dielectric layer 74 to expose contact pads 60(*a*)-(*c*). As shown most clearly in FIG. 5, trench via 76 extends along an axis that is substantially parallel to and, preferably, generally co-linear with the axis along which contact pads 60(*a*)-(*c*) are distributed (again, identified in FIG. 3 by dashed line 72). Trench via 76 includes opposing sidewalls 78, which have a crenulated planform geometry; that is, sidewalls 78 are formed to include a number of pockets or recesses 80, which extend into the remaining portions of dielectric layer 74 in lateral directions away from contact pads 60(*a*)-(*c*) and away from the sputter trajectory (described below). As can be seen most clearly in FIG. 5, adjacent or facing recesses 80 align along the longitudinal axis of trench via 76 such that via 76 has a lateral width, which varies between a maximum width (identified in FIG. 5 as "$W_{MAX}$") and a minimum width (identified in FIG. 5 as "$W_{MIN}$"). In the illustrated example, the narrow sections of crenulated trench via 76 are generally aligned with contact pads 60(*a*)-(*c*), while the wider sections of trench via 76 are staggered or interspersed with pads 60(*a*)-(*c*); however, in further embodiments, crenulated trench via 76 may be formed such that the wider sections ("$W_{MAX}$") of trench via 76 instead align with contact pads 60(*a*)-(*c*). Each recess 80 is formed to have a generally rounded rectangular planform shape in the embodiment illustrated in FIGS. 5 and 6; however, recesses 80 can be formed to have any geometry suitable for minimizing the volume of etch pad material redeposited thereon and/or for providing a discontinuous deposition surface between adjacent contact pads 60(*a*)-(*c*) or interconnect lines (described below). Recesses 80 define and are interspersed with a plurality of lateral projection, ridges, or fingers 82 formed from remaining portions of dielectric layer 74. Fingers 82 extend from the main body of remaining dielectric layer 74 toward contact pads 60(*a*)-(*c*) exposed by trench via 76. In the illustrated example, fingers 82 each terminate adjacent a contact pad 60(*a*)-(*c*) such that the end wall of the finger is substantially aligned with the contact pad sidewall, as taken through the thickness of microelectronic package 50 (into the page in FIG. 5). The lowermost edges of fingers 82 may contact the upper surfaces of contact pads 62 or may instead be spaced apart therefrom by a lateral clearance or gap.

Crenulated trench via 76 can be formed utilizing any suitable material removal process including, for example, photolithographical and laser ablation processes. For example, as shown in FIG. 6, opposing sidewalls 78 of trench via 76 may be imparted with a slanted cross-sectional profile, whether this is done purposefully or by virtue of the material removal process utilized to create trench via 76. In further embodiments, sidewalls 78 may be imparted with a near vertical cross-sectional profile, especially in embodiments wherein a reactive-ion etch or other dry anisotropic etch is employed to produce trench via 76. In still further embodiments, opposing sidewalls 78 of trench via 76 may be imparted with a contoured or sloped cross-sectional profile. Furthermore, while crenulated trench via 76 is shown and described herein as exposing a single row 60 of contact pads, it will be appreciated that the width and/or length of crenulated trench via 76 can be increased in alternative embodiments such that a single crenulated via exposes multiple neighboring rows of contact pads.

Figure 7:
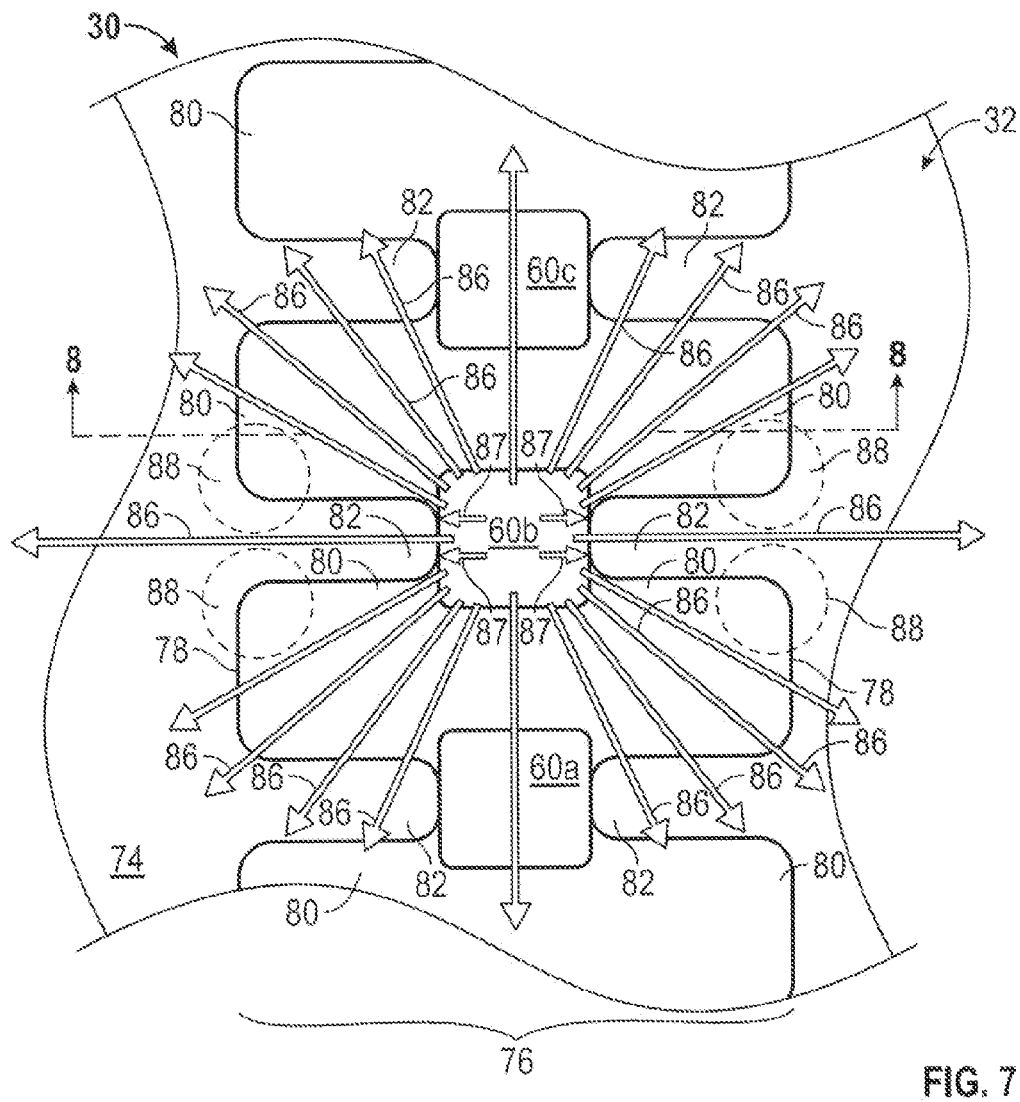
Figure 8:
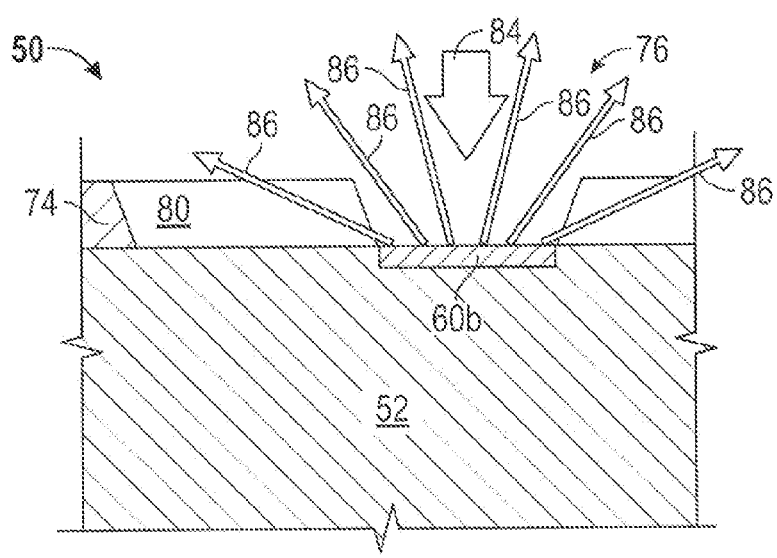

After formation of crenulated trench via 76, a sputter etch is performed to remove any oxides, debris, passivation material, or other contaminants that may be present on the surface of contact pads 60(*a*)-(*c*). As noted above, the sputter etch may be performed under process conditions optimized for removal of contaminants from contact pads, such as the contact pads included within microelectronic device 54 (FIG. 2), fabricated from materials having a low sputter rate and, thus, highly resistant to sputter etch abrasion or dislodgement. For example, a relatively aggressive radiofrequency (RF) sputter etch process may be performed under vacuum during which the contact pads are subject to an electrically- or microwave-induced plasma containing a selected type of ion, such as argon ions. However, as further noted above, such an aggressive sputter etch may cause the dislodgement or sputter of portions of the contact pads included within microelectronic device 54 (FIGS. 2-6) in embodiments wherein the contact pads included within contact pad row 58 (FIG. 2) and/or contact pad row 60 (FIGS. 2-6) are fabricated from a material susceptible to such issues. Further emphasizing this point, FIGS. 7 and 8 are top-down and cross-sectional views, respectively, of microelectronic device 52 conceptually illustrating dislodgement of contact pad material from contact pad 60(*b*) during a sputter etch process. As a result of bombardment by the selected ion species (as represented in FIG. 8 by arrow 84), atoms or particles of the contact pad material are ejected or sputtered from contact pad 60(*a*)-(*c*) (as represented in FIG. 8 for contact pad 60(*b*) by arrows 86). In general, the dislodged metallic particles will travel at various different velocities and along various different trajectories; however, the average trajectory of the particle travel will generally be upward away from the floor of trench via 76, as may be appreciated by referring to FIG. 8.

Lateral recesses or pockets 80 provided in opposing crenulated sidewalls 78 of trench via 76 preclude the formation of electrically-conductive leakage paths extending between adjacent contact pads 60(*a*)-(*c*) or adjacent interconnect lines, which are later formed over trench via 76 and contact pads 60(*a*)-(*c*), as described below in conjunction with FIGS. 15 and 16. Recesses 80 preclude the formation of such an electrically-conductive leakage path in at least one of two manners. First, recesses 80 minimize the volume of contact pad material deposited onto crenulated sidewalls 78 by allowing a greater percentage of the contact pad material particles dislodged from contact pads 60(*a*)-(*c*) to avoid impacting the sidewalls due to the upward trajectory of the dislodged particles. Second, recesses 80 disrupt the continuous sidewall surfaces that would otherwise be provided between contact pads 60(*a*)-(*c*) if trench via 76 were formed to have a generally rectangular geometry and include straight sidewalls. As a result, even if significant quantities of contact pad material are deposited within the recesses 80, or on the inner terminal ends of fingers 82 (as represented in FIG. 7 by arrows 87), a continuous or unbroken electrically-conductive path generally cannot be formed between neighboring contact pads 60(*a*)-(*c*) or between the regions of the trench sidewalls located adjacent the contact pads. Furthermore, as indicated in FIG. 7 by circled areas 88, shadow zones are created within each recess 80, which are shielded by the inner terminal ends of fingers 82 from dislodged particles emitted from at least one of the nearby contact pads. Thus, in the exemplary case shown in FIG. 7 and referring specifically to contact pad 60(*b*), opposing fingers 82 positioned adjacent contact pad 60(*b*) block or prevent a direct line-of-sight to an area of each adjoining recess 80 provided in crenulated trench sidewalls 78. It will be noted that material sputtered from neighboring contact pads 60(*a*) and 60(*c*) may still potentially reach shadow zones 88 within recesses 80 during sputter etching; however, such a partial shielding of shadow zones 88 within recesses 80 still reduces the likelihood of the formation of a continuous or unbroken electrically-conductive path between contact pads 60(*a*)-(*c*) or the subsequently-formed interconnect lines due to excessive redeposition of contact pad material. In further embodiments, such as those described below in conjunction FIGS. 22-25, recesses 80 may be imparted with different planform geometries to create full shielding of shadow zones to which a direct line-of-sight is not provided by any of contact pads 60(*a*)-60(*c*) and, therefore, within which contact pad material generally cannot be redeposited during sputter etching.

Figure 9:
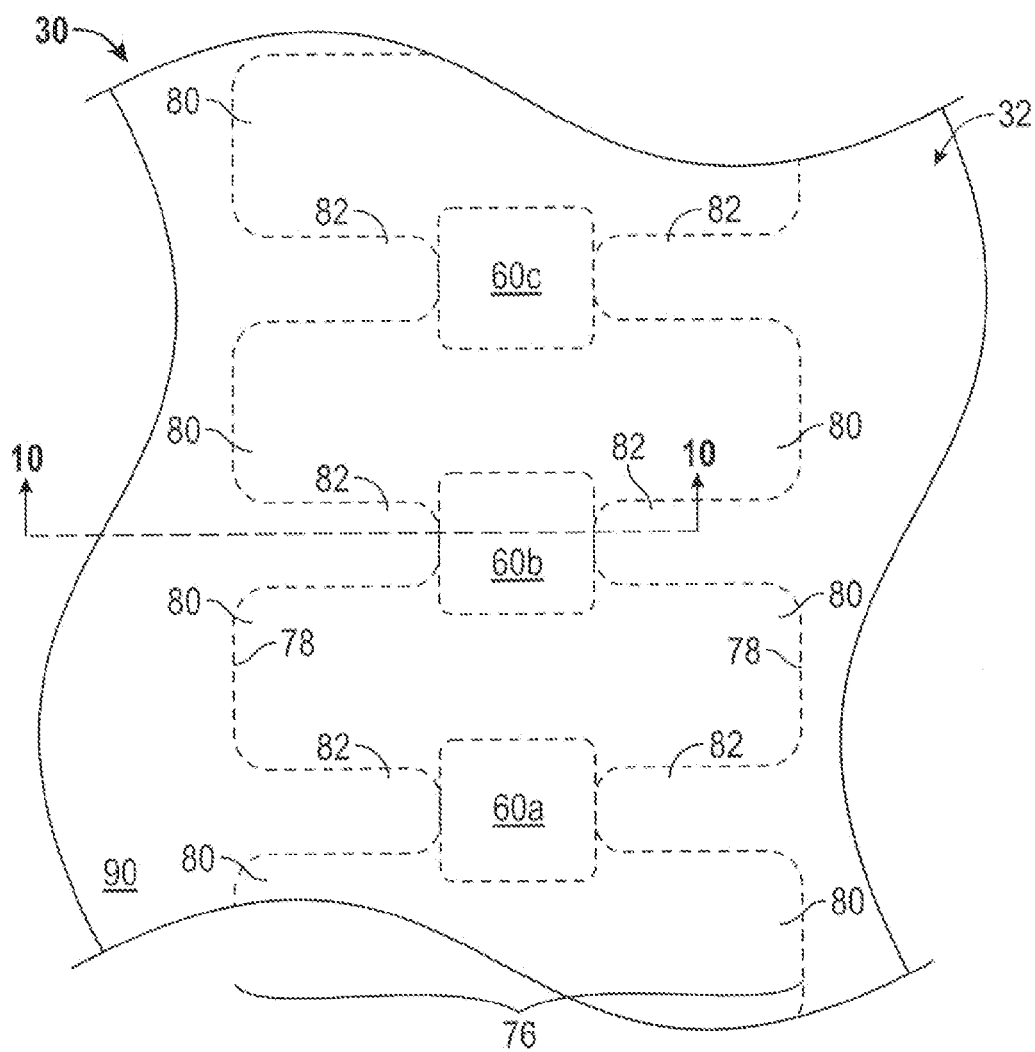
Figure 10:
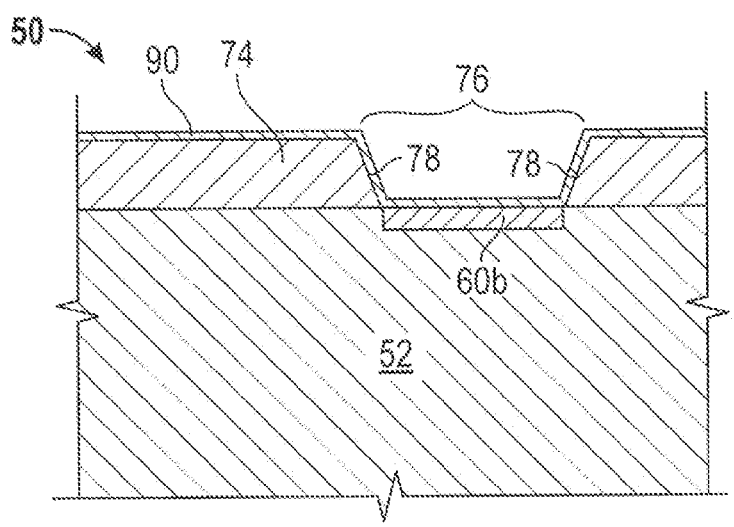
Figure 11:
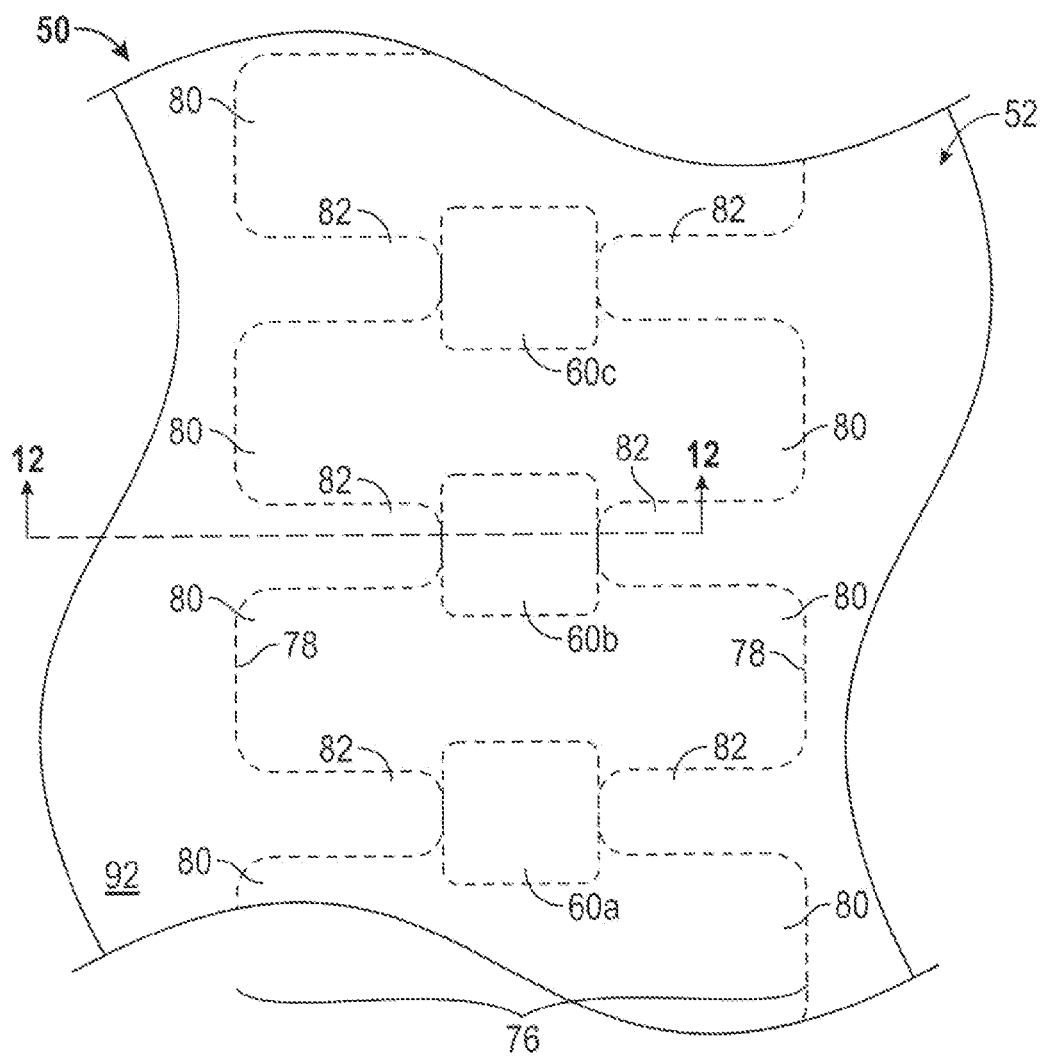
Figure 12:
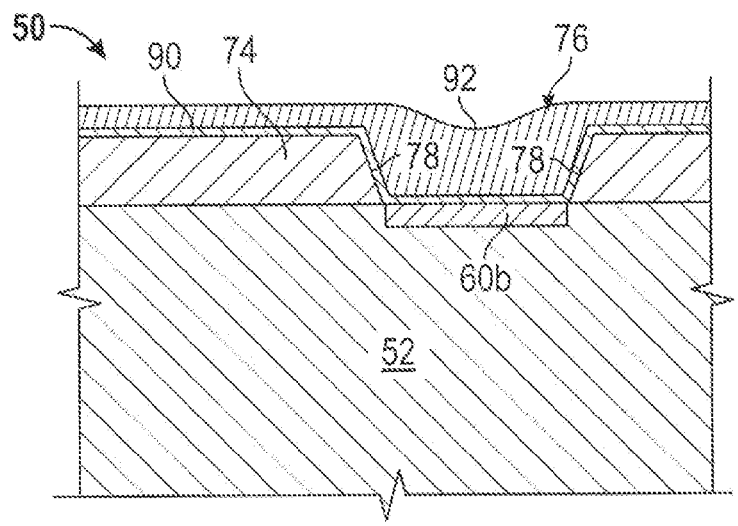
Figure 13:
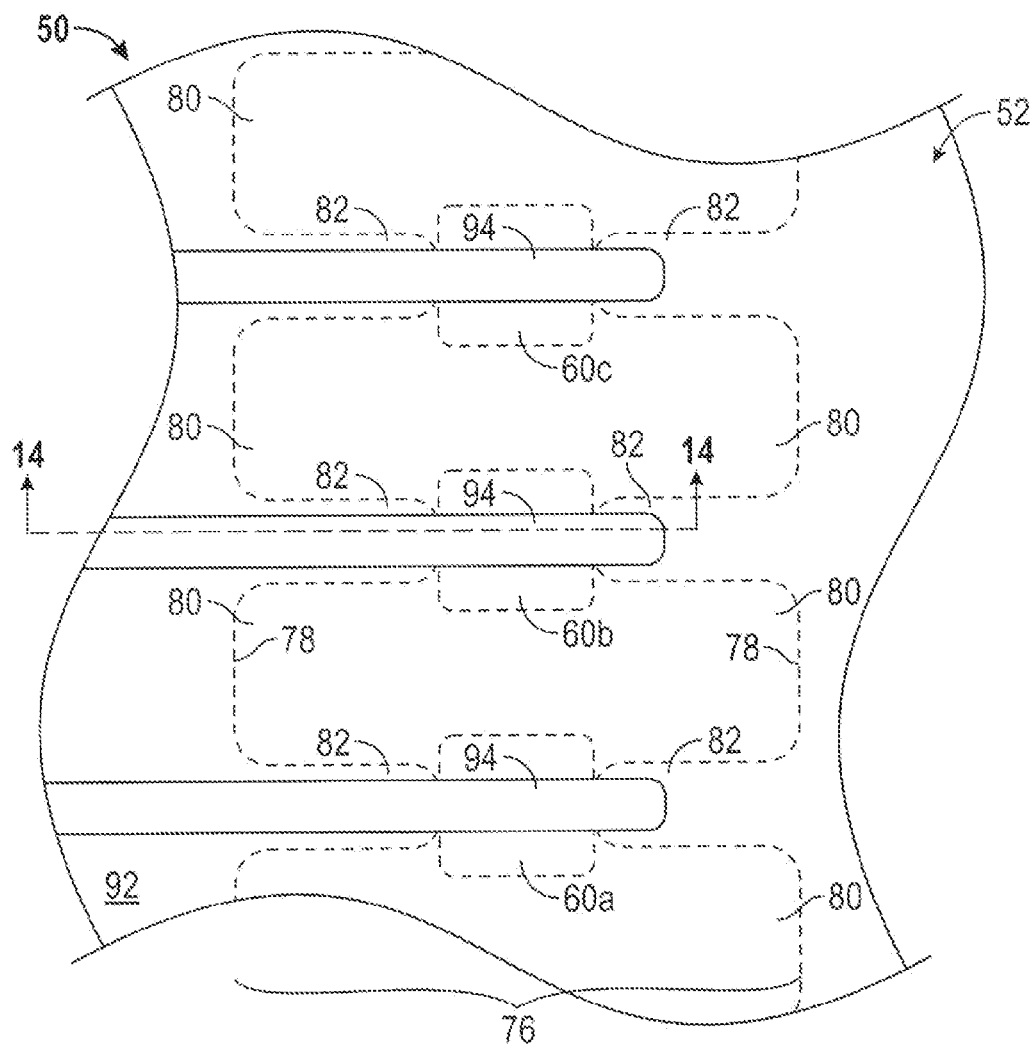
Figure 14:
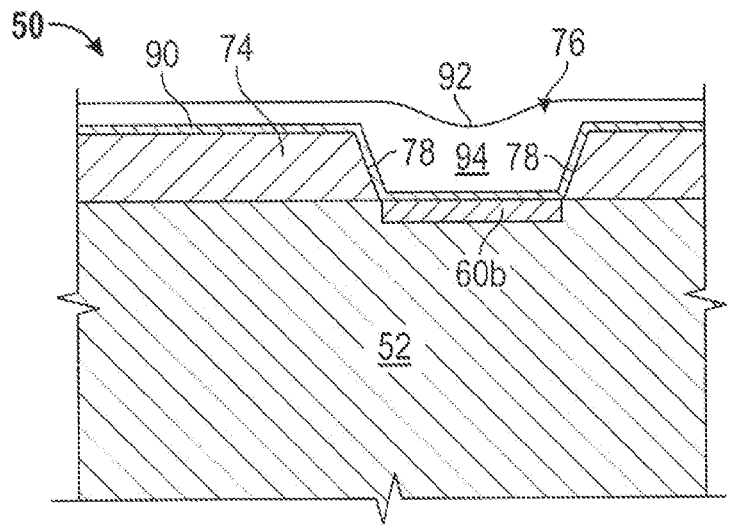

With contaminants now removed from contact pads 60(*a*)-(*c*) (FIGS. 2-7), as well as the contact pads included within contact pad rows 58, 62, and 64 (FIG. 2), additional processing steps can now be performed to complete formation of the fine pitch interconnect structure and, more generally, to complete production of the redistribution layers over device surface 66 (FIG. 2) of microelectronic package 50 (FIG. 2). For example, and by way of non-limiting illustration, a seed layer 90 may be deposited over the upper surface of dielectric layer 74, into crenulated trench via 76, and over contact pads 60(*a*)-(*c*), as illustrated in FIGS. 9 and 10. The seed layer may be, for example, titanium, tungsten, copper, or any combination thereof deposited utilizing a blanket deposition process, such as electroless plating. Next, as illustrated in FIGS. 11 and 12, a layer 92 of a photoimagable or photodefinable material, such as photoresist, may be deposited over seed layer 90. The photoresist layer 92 may then be patterned utilizing a known photolithographical process to form interconnect openings 94 within layer 92 having the desired layout of the subsequently-formed interconnect lines. The resultant structure is shown in FIGS. 13 and 14. As can be seen in FIG. 13, a terminal end of each interconnect opening 94 may extend across a one of fingers 82 and the adjoining contact pad 60. As indicated in FIG. 13, the interconnect opening 94 may extend entirely across each contact pad 60, thus bridging the gap between aligning fingers 82; however, this need not always be the case.

Figure 15:
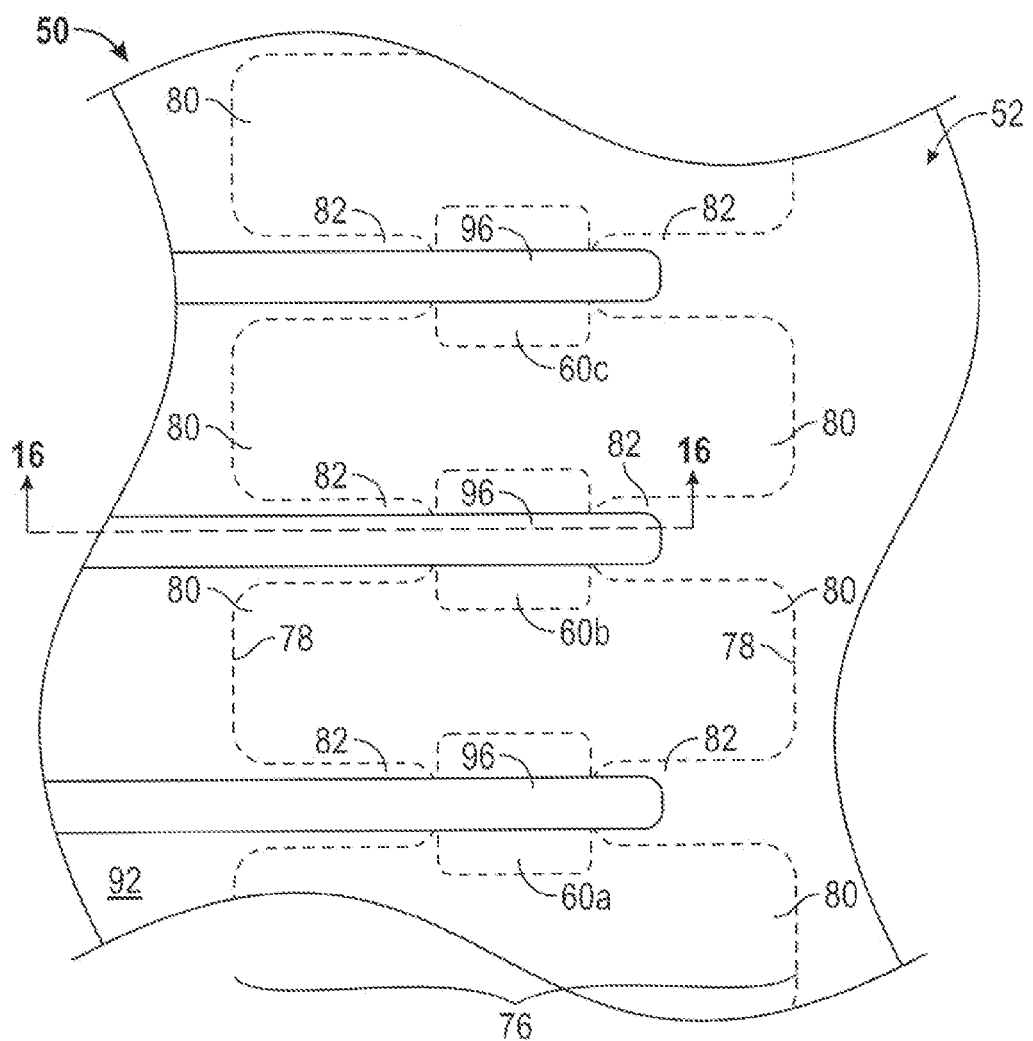
Figure 16:
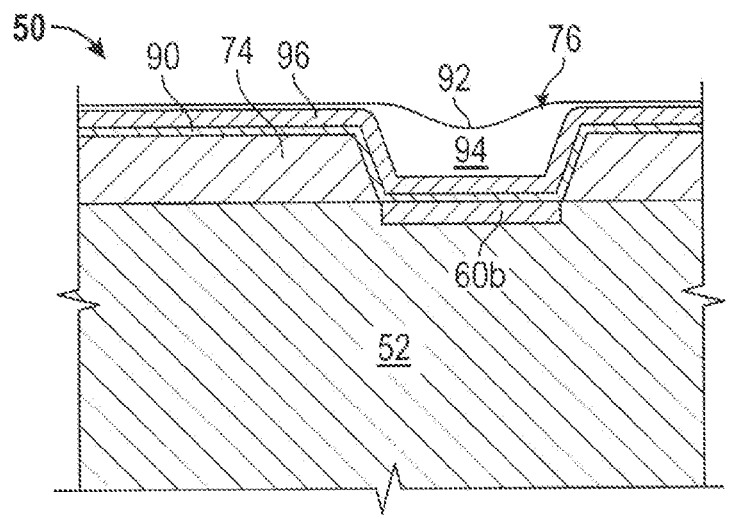
Figure 17:
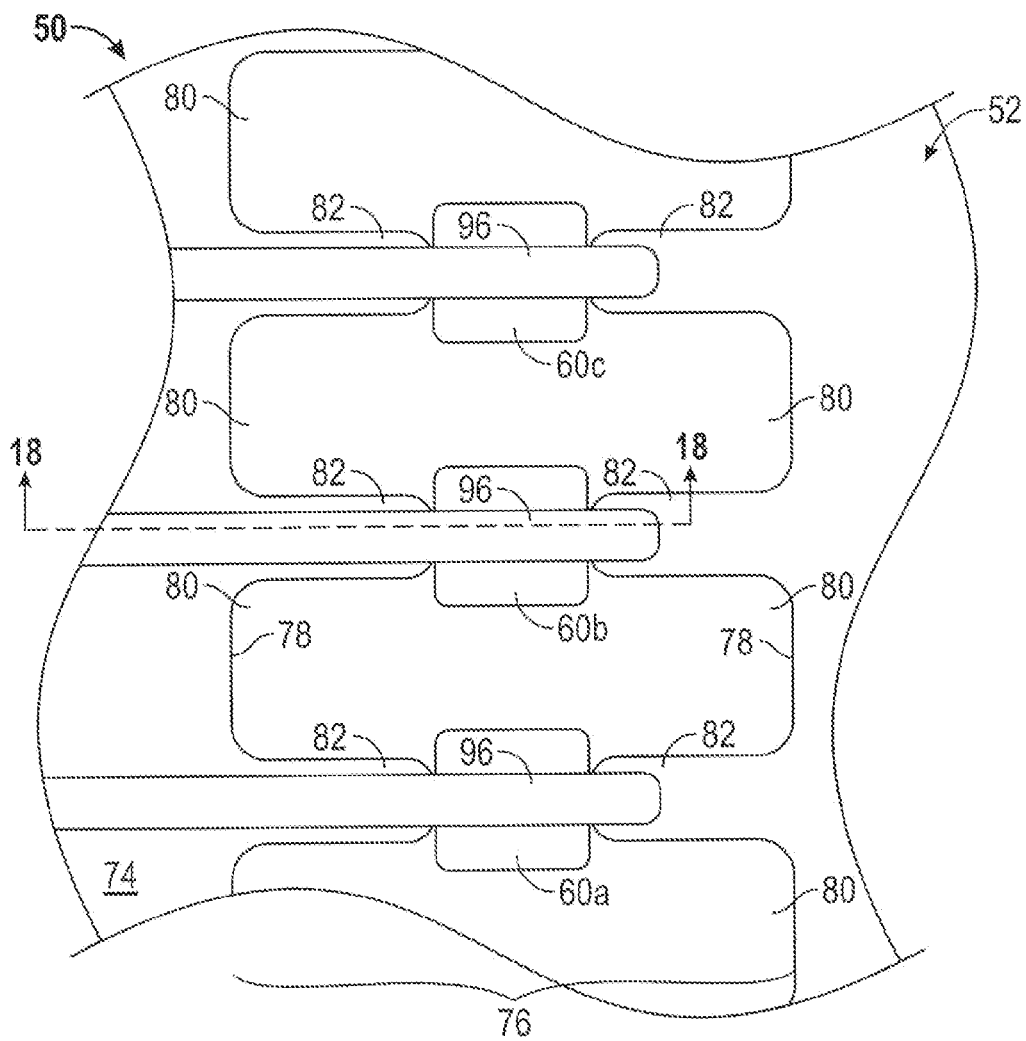
Figure 18:
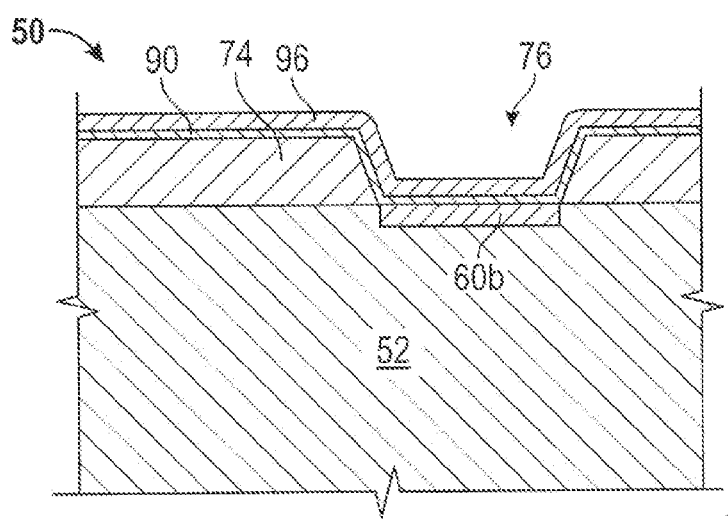
Figure 19:
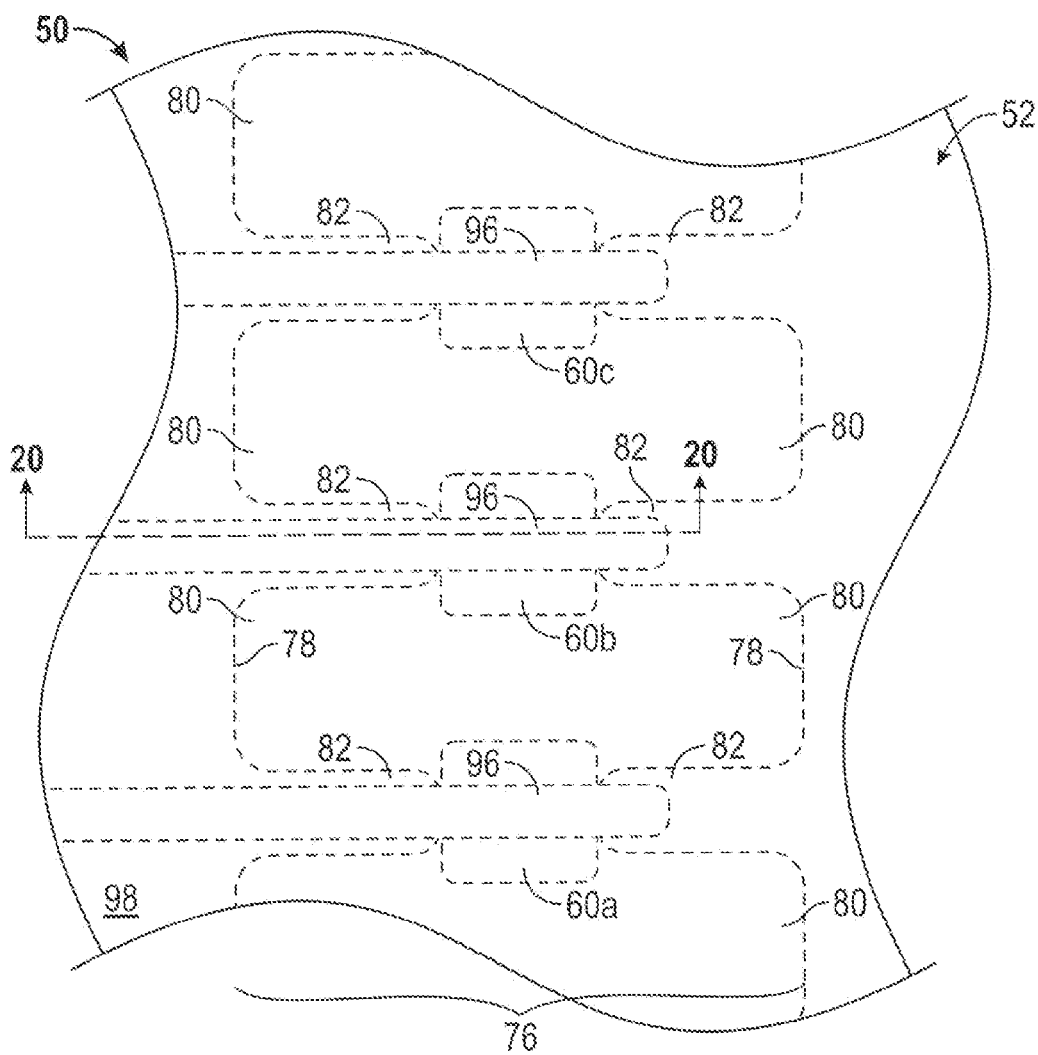
Figure 20:
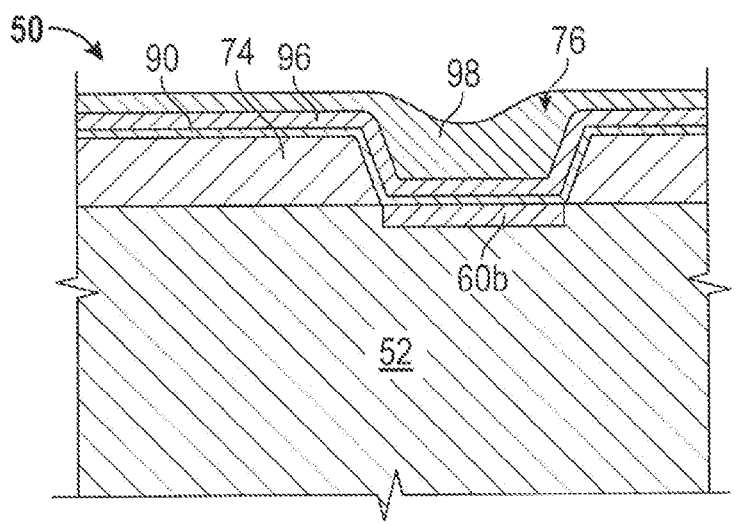

Advancing to FIGS. 15 and 16, conductive material is next deposited into each interconnect opening 94. In one embodiment, a metal is formed by electroplating the portions of seed layer 90 exposed through openings 94; however, any suitable deposition or metallization process can be utilized including, for example, electroless plating. This results in the formation of interconnect lines 96 (e.g., metal traces) extending over dielectric layer 74, across fingers 82, and into crenulated trench via 76 to make ohmic contact with contact pads 60(*a*)-(*c*) through seed layer 90. Each interconnect line 96 is formed to contact a different contact pad 60(*a*)-(*c*); however, interconnect lines 96 remain electrically bridged by underlying seed layer 90. Thus, to electrically isolate interconnect lines 96, photoresist layer 92 and underlying seed layer 90 are removed utilizing, for example, chemical stripping and etching processes, respectively. The resultant structure is shown in FIGS. 17 and 18. Finally, one or more layers 98 of dielectric and/or passivation material may be deposited over microelectronic package 50, and specifically over interconnect lines 96, dielectric layer 74, and the floor of trench via 76 of microelectronic device 52 to yield the structure shown in FIGS. 19 and 20. Known processing steps may then be carried-out to complete fabrication of microelectronic package 50 including, for example, fabrication of additional redistribution layers (if needed); the formation of a ball grid array, lead array, or other contact array over the uppermost redistribution layer; and, if the microelectronic package 50 is produced utilizing an RCP manufacturing process and package body 56 (FIG. 2) remains joined to neighboring the bodies of neighboring packages making-up an RCP device panel, the RCP device panel may be singulated using, for example, a dicing saw to separate microelectronic package 50 and the other packages into discrete units.

Figure 21:
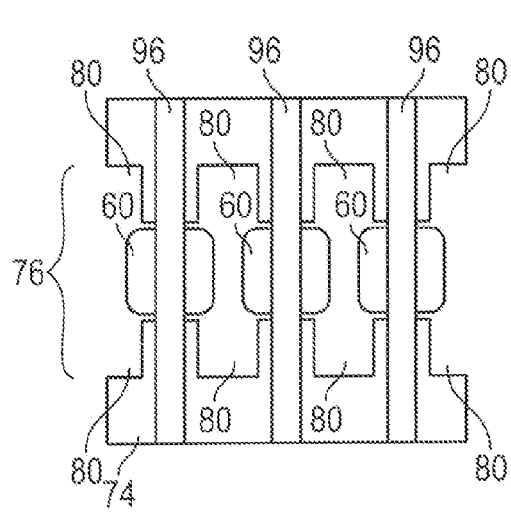
FIGS. 21-25 are top-down views of partially-completed microelectronic packages (only limited portions of which are shown) illustrating different planform geometries with which the crenulated through trench vias can be imparted in accordance with further exemplary embodiments of the present invention.
Figure 22:
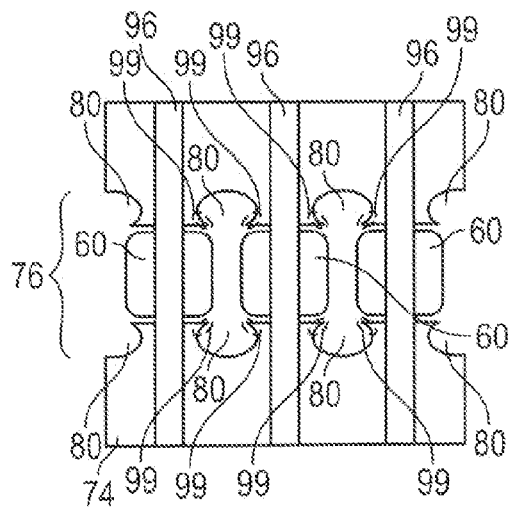
Figure 23:
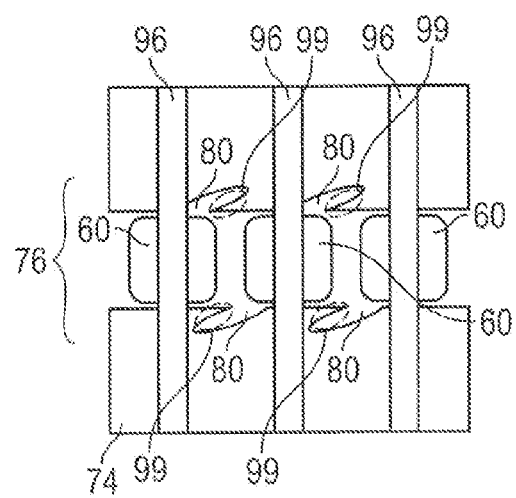
Figure 24:
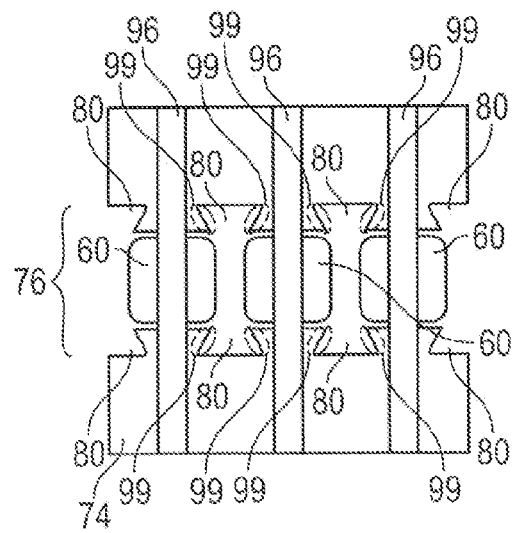
Figure 25:
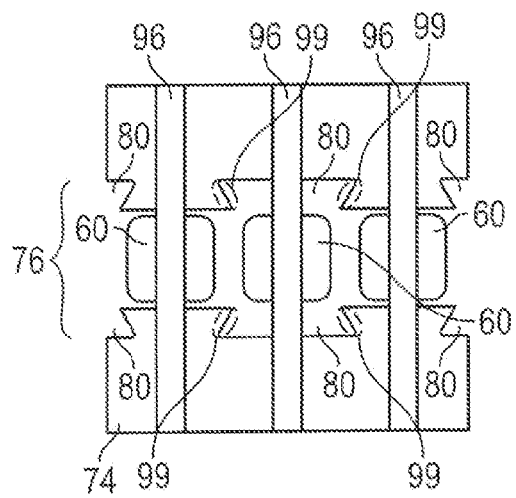

The foregoing has thus provided embodiments of a fabrication method for producing a microelectronic package including at least one crenulated trench via. In the above-described exemplary embodiment, the opposing crenulated sidewalls of the trench via were each fabricated to include a series of spaced-apart pockets or recesses having a generally rounded rectangular planform geometry. However, it will be appreciated that the recesses provided in the crenulated sidewalls can be imparted with various other geometries including, but not limited to, a rectangular planform geometries (an example of which is shown in FIG. 21 wherein like reference numerals are utilized to identify like structural elements), rounded or elliptical planform geometries (examples of which are shown in FIGS. 22 and 23), and trapezoidal or dovetail-shaped geometries wherein the width of each recess increases with decreasing proximity to the centerline or axis along which the contact pads are spaced (examples of which are shown in FIGS. 24 and 25). Furthermore, and referring specifically to the exemplary embodiment illustrated in FIG. 25, the recesses need not be interspersed with each contact pad; instead, as shown in FIG. 25, the recesses or crenulations may be formed to generally align with alternating contact pads in the row of contact pads, and a different one of the plurality of interconnect lines may extend across each of the plurality of recesses. Such a configuration increases the feature size of the recesses relative to the contact pad pitch and, thus, may be especially useful in forming fine pitch interconnect features that may otherwise be difficult to form due to limitations inherent in photolithographical resolution. Lastly, referring specifically to the exemplary embodiments shown in FIGS. 22-25, and as indicated in these figures by circled areas 99, shadow zones are created within each recess 80, which the crenulated sidewalls of trench vias 76 fully shield from any dislodged particles or atoms emitted from contact pads 60(*a*)-(*c*) during the sputter etch process. Stated differently, a direct line-of-sight is not provided from any of contact pad 60(*a*)-60(*c*) to the regions of the crenulated trench sidewalls or recesses 80 located within shadow zones 99 that would allow the redeposition of the contact pad material on the crenulated trench sidewalls during sputter etching. This prevents the formation of a continuous or unbroken electrically-conductive path between contact pads 60(*a*)-(*c*) or the subsequently-formed interconnect lines due to redeposition of contact pad material.

Figure 26:
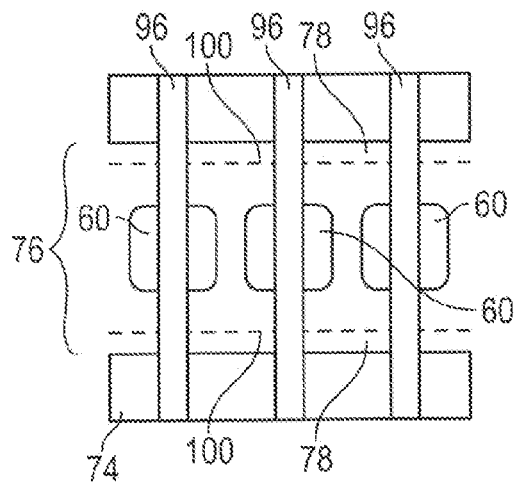
FIGS. 26 and 27 are top-down and cross-sectional views, respectively, of a partially-completed microelectronic package having a laterally-offset trench via, as illustrated in accordance with a further exemplary embodiment of the present invention.
Figure 27:
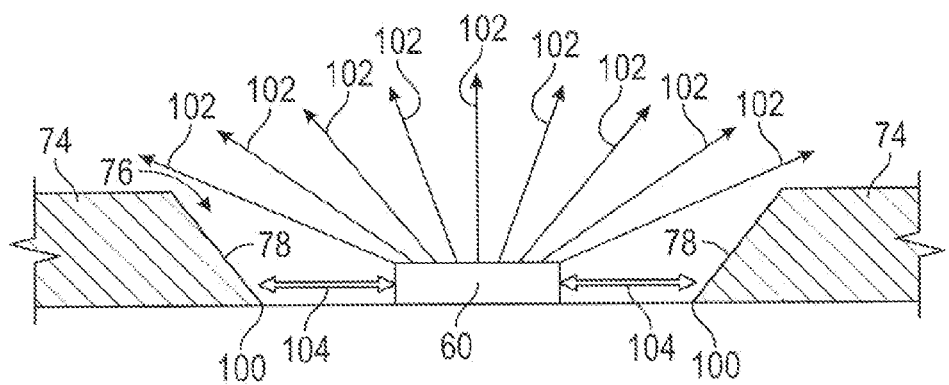

In the above-described exemplary embodiments, one or more trench vias were formed to include crenulated walls; however, in addition to or as an alternative to imparting the trench via sidewalls with a crenulated planform shape, a lateral clearance may be provided between the contact pads and the lower edges of the trench sidewalls to minimize the volume of contact pad material deposited onto the sidewalls during a high energy sputter etch in further embodiments of the present invention. Further illustrating this concept, FIG. 26 is a top-down view of a portion of a microelectronic device wherein like reference are utilized to denote like structural elements and wherein the illustrated microelectronic device is shown in a partially-completed state. As was the case previously, the microelectronic device shown in FIG. 26 is formed to include a trench via 76 exposing a number of contact pads 60 through dielectric layer 74. However, in this embodiment, the opposing sidewalls 78 of trench via 76 do not have a crenulated geometry and, instead, are formed to have a substantially straight or linear planform shape. As indicated in FIG. 26 by dashed lines 100, the lower edges of trench via sidewalls 78 are each set-back or offset from contact pads 60 by a lateral gap to minimize the volume of contact pad material redeposited thereon during the sputter etch process. The interconnect lines, when formed, may extend across this gap to make ohmic contact with contact pads 60. This may be more fully appreciated by referring to FIG. 27, which illustrates the travel of dislodged metallic particles or atoms during sputter etching (represented in FIG. 27 by arrows 102). By way of non-limiting example, the lateral offset or clearance between lower edges 100 of trench via sidewalls 78 and the outer edges of contact pads 60 (represented in FIG. 27 by double-headed arrows 104) may be about 5 to about 100 microns in width. As shown most clearly in FIG. 27, trench sidewalls 78 may also be formed to have a relatively gentle slope or slant to further minimize the volume of contact pad material deposited thereon during sputter etching.

The foregoing has thus provided embodiments of a microelectronic package, such as System-in-Package, including at least one microelectronic device having a high density, trench via-based interconnect structure wherein the formation of undesired electrical leakage paths is precluded even when one or more of the contact pads are fabricated from a material prone to sputter etch dislodgement and a high energy sputter etch is performed during the fabrication process. In certain embodiments, this is accomplished by imparting the trench vias with crenulated, undulating, or pocketed sidewalls, which form particle-shielded shadow regions and/or otherwise disrupt the continuous surface typically provided by the trench via sidewall to prevent contact pad material redeposited onto the trench sidewalls from forming a continuous leakage path between neighboring contact pads or interconnect lines. Additionally, the recesses or pockets formed in the crenulated trench via sidewalls may also minimize the volume of contact pad material deposited onto the sidewalls by allowing a greater percentage of the contact pad material atoms or particles dislodged from the contact pad to avoid impacting the sidewalls during the sputter etch process.

The foregoing has further provided embodiments of a method for fabricating such a microelectronic package. In one embodiment, the method includes the step of depositing a dielectric layer over a first microelectronic device having a plurality of contact pads, which are covered by the dielectric layer. The dielectric layer is etched to form a trench via exposing the plurality of contact pads through the dielectric layer. The trench via is formed to include opposing crenulated sidewalls having a plurality of recesses therein. The plurality of contact pads exposed through the trench via are then sputter etched. A plurality of interconnect lines is formed over the dielectric layer, each of which is electrically coupled to a different one of the plurality of contact pads. For example, each interconnect line may be formed to extend into the trench via and to contact a different one of the plurality of contact pads.

In a further embodiment, the above-described fabrication method includes the steps of depositing a dielectric layer over a first microelectronic device having a plurality of contact pads, which are covered by the dielectric layer. Selected portions of the dielectric layer are removed (e.g., via etching or photolithographical patterning) to form a trench via exposing the plurality of contact pads through the dielectric layer. The trench via is formed to include opposing sidewalls having at least one segment offset from the plurality of contact pads by a lateral gap. The plurality of contact pads exposed through the trench are sputter etched. A plurality of interconnect lines is formed over the dielectric layer, extending into the trench via, and across the lateral gap to contact the plurality of contact pads located within the trench via.

Embodiments of a microelectronic package have also been provided. In one embodiment the microelectronic package includes a first microelectronic device having a plurality of contact pads. A dielectric layer overlays the first microelectronic device. The trench via has opposing crenulated sidewalls and extends over the plurality of contact pads. A plurality of interconnect lines is formed over the dielectric layer, extending into the trench via, and each contacting or otherwise electrically coupled to a different one of the plurality of contact pads within the trench via.

While described above in the context of multiple exemplary embodiments, it is emphasized that most, if not all, of the above-disclosed features can be combined to yield additional embodiments of the microelectronic package. For example, an embodiment of the microelectronic package can be produced wherein the microelectronic package includes at least one trench via having crenulated sidewalls with certain crenulations or recesses of a first planform geometry (e.g., a first of the planform geometry shown in FIGS. 5-20, in FIG. 21, in FIG. 22, in FIG. 23, in FIG. 24, or in FIG. 25) in addition to crenulations of a second planform geometry (e.g., a second of the planform geometries shown in FIGS. 5-20, in FIG. 21, in FIG. 22, in FIG. 23, in FIG. 24, or in FIG. 25). Considering this, it should be appreciated that a crenulated sidewall described as having crenulations or recesses of a first shape (e.g., a substantially rectangular planform geometry similar to that shown in FIGS. 5-20 or in FIG. 21) does not preclude that the crenulated sidewall may also include recesses of a second, different shape (e.g., a substantially circular, ellipsoidal, or dovetail-shaped planform geometry similar to that shown in FIGS. 22, 23, and 24, respectively), which may be interspersed with the crenulations of the first shape in, for example, an alternating relationship. Such features are therefore not mutually exclusive in the context of the present disclosure.

While at least one exemplary embodiment has been presented in the foregoing Detailed Description, it should be appreciated that a vast number of variations exist. It should also be appreciated that the exemplary embodiment or exemplary embodiments are only examples, and are not intended to limit the scope, applicability, or configuration of the invention in any way. Rather, the foregoing Detailed Description will provide those skilled in the art with a convenient road map for implementing an exemplary embodiment of the invention. It being understood that various changes may be made in the function and arrangement of elements described in an exemplary embodiment without departing from the scope of the invention as set-forth in the appended claims.

What is claimed is:

1. A method for fabricating a microelectronic package, comprising:
   depositing a dielectric layer over a first microelectronic device having a plurality of contact pads, the dielectric layer covering the plurality of contact pads;
   forming a trench via in the dielectric layer exposing the plurality of contact pads therethrough, the trench via formed to include opposing crenulated sidewalls having a plurality of recesses interspersed with a plurality of elongated fingers;
   sputter etching the plurality of contact pads exposed through the trench via; and
   forming a plurality of interconnect lines over the dielectric layer each electrically coupled to a different one of the plurality of contact pads;
   wherein the plurality of elongated fingers have inner terminal ends terminating adjacent the plurality of contact pads, and wherein the inner terminal ends of the plurality of elongated fingers at least partially shield regions of the opposing crenulated sidewalls from deposition of particles dislodged from the plurality of contact pads during sputter etching.

2. A method according to claim 1 wherein the step of depositing comprises depositing the dielectric layer over a second microelectronic device in addition to the first microelectronic device, the second microelectronic device having a plurality of contact pads formed from a different material than are the contact pads included within the first microelectronic device.

3. A method according to claim 2 wherein the contact pads included within the first microelectronic device comprise one of the group consisting of palladium, gold, copper, tin, silver, and lead.

4. A method according to claim 2 further comprising combing the first and second microelectronic devices as a system-in-package.

5. A method according to claim 1 wherein the microelectronic device is included within a fan-out wafer level package.

6. A method according to claim 1 wherein the first microelectronic device is encapsulated within a package body having a device surface through which the first microelectronic device is exposed, and wherein the method further comprises:
   forming redistribution layers over the device surface and in ohmic contact with the plurality of contact pads, the redistribution layers including the dielectric layer and the plurality of interconnect lines; and
   producing a contact array electrically coupled to the plurality of contact pads through the redistribution layers.

7. A method according to claim 1 wherein at least one of the plurality of contact pads comprises one of the group consisting of palladium and gold.

8. A method according to claim 1 wherein the opposing crenulated sidewalls comprise recesses located laterally between neighboring ones of the plurality of interconnect lines.

9. A method according to claim 1 wherein forming comprises removing selected portions of the dielectric layer to form a trench exposing the contact pads, while leaving intact portions of the dielectric layer over which the plurality of interconnect lines are formed.

10. A method according to claim 9 wherein the portions of the dielectric layer left intact extend inwardly from the main body of the dielectric layer and terminate adjacent the contact pads.

11. A method according to claim 1 wherein the recesses are each imparted with one of the group consisting of a substantially rectangular planform geometry, a substantially ellipsoidal planform geometry, and a substantially dovetail-shaped planform geometry.

12. A method for fabricating a microelectronic package, comprising:
   depositing a dielectric layer over a first microelectronic device including a row of contact pads, the dielectric layer covering the row of contact pads;
   forming a trench via in the dielectric layer exposing the plurality of contact pads therethrough, the trench via formed to include opposing crenulated sidewalls having a plurality of recesses adjacent to alternating contact pads in the row of contact pads;
   sputter etching the plurality of contact pads exposed through the trench via; and
   forming a plurality of interconnect lines over the dielectric layer each electrically coupled to the plurality of contact pads, the plurality of interconnect lines formed such that a different one of the plurality of interconnect lines extends across each of the plurality of recesses included in at least one of the opposing crenulated sidewalls.

13. A method according to claim 1 further comprising forming the recesses to have repeating planform shapes providing a discontinuous sidewall deposition surface during sputter etching between adjacent contact pads in the plurality of contact pads.

14. A method for fabricating a microelectronic package, comprising:
   depositing a dielectric layer over a microelectronic device having a plurality of contact pads, the dielectric layer covering the plurality of contact pads;
   forming a crenulated trench via in the dielectric layer exposing the plurality of contact pads therethrough, the crenulated trench via comprising alternating narrow and wide sections, the narrow sections comprising elongated fingers substantially aligned with the plurality of contact pads and having inner terminal ends terminating adjacent the plurality of contact pads;
   sputter etching the plurality of contact pads exposed through the crenulated trench via; and
   producing interconnect lines over the dielectric layer and extending into the crenulated trench via to electrically contact the plurality of contact pads.

15. A method according to claim 14 further comprising forming the crenulated trench via such that the wide sections are interspersed with the plurality of contact pads.

16. A method according to claim 14 wherein producing comprises producing the interconnect lines to extend along the plurality of fingers, into the crenulated trench, and to the plurality of contacts.

17. A method according to claim 14 further comprising forming the alternating narrow and wide sections to define recesses in opposing sidewalls of the crenulated trench via, the recesses each comprising a shadow zone at least partially shielded from particles dislodged from the plurality of contact pads during sputter etching.

18. A method according to claim 14 further comprising forming the crenulated trench via such that the alternating narrow and wide sections provide a discontinuous sidewall deposition surface during sputter etching between adjacent contact pads in the plurality of contact pads.

\* \* \* \* \*